United States Patent [19]
Ouellette et al.

[11] Patent Number: 4,482,197
[45] Date of Patent: Nov. 13, 1984

[54] LOW-INSERTION FORCE SOLDER-BEARING LEAD

[75] Inventors: Paul J. Ouellette, Amesbury, Mass.; Vincent F. Riviezzo, Salem, N.H.

[73] Assignee: AT&T Technologies, Inc., New York, N.Y.

[21] Appl. No.: 437,723

[22] Filed: Oct. 29, 1982

[51] Int. Cl.³ .............................................. H01R 4/02
[52] U.S. Cl. .............................. 339/17 C; 339/258 R; 339/275 B
[58] Field of Search ............ 339/17 C, 17 LM, 17 M, 339/258 R, 258 P, 275 R, 275 B, 275 T

[56] References Cited

U.S. PATENT DOCUMENTS

| | | | |
|---|---|---|---|
| 3,351,704 | 11/1967 | Sitzler | 174/84 |
| 3,601,775 | 8/1971 | Longenecker et al. | 339/258 P |
| 3,750,252 | 8/1973 | Landman | 29/191.6 |
| 3,953,102 | 4/1976 | Rivetta et al. | 339/258 R |
| 3,993,383 | 11/1976 | Marino | 339/258 P |
| 4,019,803 | 4/1977 | Schell | 339/275 B |
| 4,028,794 | 6/1977 | Ritchie et al. | 339/17 M |
| 4,085,998 | 4/1978 | Owens | 339/275 B |
| 4,120,558 | 10/1978 | Seidler | 339/275 T |
| 4,177,554 | 12/1979 | Deveres et al. | 29/741 |
| 4,203,648 | 5/1980 | Seidler | 339/275 T |
| 4,302,067 | 11/1981 | Monson et al. | 339/275 R |
| 4,345,814 | 8/1982 | Gutbier et al. | 339/275 R |
| 4,357,069 | 11/1982 | Milora | 339/275 R |
| 4,379,608 | 4/1983 | Olsson et al. | 339/176 MP |
| 4,433,892 | 2/1984 | Seidler | 339/258 P |

Primary Examiner—John McQuade
Assistant Examiner—Gary F. Paumen
Attorney, Agent, or Firm—D. D. Bosben

[57] ABSTRACT

A low-insertion force solder-bearing lead (10) includes a resilient clamping finger (20) having an inner planar surface (48) for engaging a planar surface (50) of a substrate circuit device (16) in parallel mating relationship. Respective portions (26 and 28) of a resilient contact finger (22) and a solder preform (12) define a noncircular camming surface (58) which extends relative to the inner planar surface (48) of the clamping finger (20) at an angle of not more than 45° to facilitate flexing of the contact finger in the assembling of the lead (10) to the substrate circuit device (16). Portions (68) of the solder preform (12) smear across a contact pad (14) during the lead assembling operation to facilitate wetting of the preform to the contact pad in a subsequent soldering operation. During the assembling operation, compressive forces also are applied to the lead (10) above and below substrate-engaging stop tabs (56) to force the clamping finger (20) and the contact finger (22) into firm engagement with respective opposite sides of the substrate circuit device (16).

10 Claims, 5 Drawing Figures

LOW-INSERTION FORCE SOLDER-BEARING LEAD

TECHNICAL FIELD

This invention relates to a low-insertion force solder-bearing lead, and more particularly to a low-insertion force solder-bearing lead of the type having a contact finger which is wrapped about a solder preform.

BACKGROUND OF THE INVENTION

A solder bearing lead is known in which the lead includes opposed resilient clamping fingers projecting from one end of an elongated stem, wherein a central finger defines an electrical contact and a pair of spaced outer fingers have an inverted curved configuration. The clamping fingers include opposed inner surfaces which define a gap for the reception of a rigid substrate circuit device, such that the inner surface on the electrical contact clamping finger engages a contact pad on the substrate circuit device. On an outer opposite surface of the contact clamping finger, the contact clamping finger carries a cylindrical solder preform as a result of the contact clamping finger having been wrapped about the solder preform in a circular configuration. The solder preform, upon being temporarily subjected to heat in a soldering operation, initially melts and flows over opposite sides of the contact finger on the contact pad, and then resolidifies to bond the lead to the contact pad. Solder-bearing leads of this type are shown in U.S. Pat. Nos. 4,120,558 and 4,203,648 to J. Seidler, and U.S. Pat. No. 4,345,814 to E. A. Gutbier et al.

U.S. Pat. No. 4,302,067 to R. R. Monson et al. discloses a solder-bearing lead in which portions of a solder preform carried on an outer surface of a lead contact finger directly engage a contact pad on a substrate circuit device to facilitate flow of molten solder from the preform over the contact pad in a soldering operation. In this regard, in the Monson et al. patent the contact finger is crimped about the center of the solder preform in a circular configuration so as to deform the preform into an hourglass or "bowtie" configuration such that opposite ends of the preform engage the contact pad when the lead is mounted on the contact pad.

Copending patent application Ser. No. 402,631, filed on July 28, 1982, in the name of R. D. Mackay and entitled "Solder-Bearing Lead Having a Solder Preform Engageable Directly With a Contact Pad," and assigned to the same assignee as the subject application, also discloses a solder-bearing lead in which a cylindrical solder preform directly engages a contact pad on a substrate circuit device to facilitate flow of molten solder from the preform over the contact pad in a soldering operation. In this regard, in the R. D. Mackay application an inner surface of a contact finger of a lead is wrapped about the solder preform in a circular configuration and in a direction such that a surface portion of the cylindrical preform projects from the contact finger for direct engagement with the contact pad when the lead is mounted on the contact pad. When the lead is temporarily subjected to heat in a soldering operation, the solder preform melts and flows directly over the contact pad and then resolidifies to form a soldered connection having an outer end portion of the contact finger embedded therein.

Further, copending patent application Ser. No. 402,684, filed on July 28, 1982, in the name of P. J. Ouellette and entitled "Lead Having a Solder Preform and Preform Carrying Finger Engageable Directly With a Contact Pad", and assigned to the same assignee as the subject application, discloses a solder bearing lead similar to that disclosed in the Mackay application. However, in the Ouellette application the contact clamping finger which carries the solder preform also directly engages the contact pad to which the lead is to be soldered, to produce an electrical and mechanical connection between the lead and the contact pad.

Solder-bearing leads as above described normally are fabricated in strip form in a progressive punch-and-die from a strip of phosphorous bronze base metal which has been provided with thin tin coatings on opposite sides thereof, to facilitate the subsequent making of electrical connections to the leads. During the lead fabrication process in the progressive punch-and-die, a continuous solder wire is attached to the contact fingers of the leads and subsequently clipped between the leads to form the solder preforms on the leads.

The substrate circuit devices normally are fabricated by forming a plurality of thin film circuits on one side of a ceramic substrate. The thin film circuits then are separated by laser-scribing lines in the circuit side of the ceramic substrate and snapping the substrate along the scribed lines to produce the individual substrate circuit devices.

The leads may be mounted on substrate circuit devices utilizing automatic apparatus as disclosed in U.S. Pat. No. 4,177,554 to E. E. Deveres et al., to form lead-substrate circuit device assemblies. The leads then are soldered to the substrate circuit devices as above described, in a mass soldering operation in which the lead-substrate circuit device assemblies are mounted in carriers in inclined, closely adjacent relationship. Subsequently, the stems of the leads, which are formed integrally with an elongated continuous support rail during the lead fabrication process, are clipped from the rail to produce operable electrical devices.

Each of the resultant electrical devices then is electrically tested to determine the integrity of the electronic circuitry and of the soldered connections between the leads and their respective contact pads on the substrate circuit devices. In this regard, it has been found that in a number of instances in which failures occur, the failures are due to metal shavings having become engaged across and shorting out adjacent ones of the contact pads or associated thin film circuits on the substrate circuit device. In other instances, the failures have been found to be of a mechanical type. For example, the failure may be the result of the substrate circuit device having caused one of the contact clamping fingers to be "rolled back" away from its respective contact pad as the leads are mounted on the device. In other instances, it has been found that the solder-bearing lead has fallen off the substrate circuit device as a result of the "roll back" of the contact finger, or as a result of the substrate-receiving gap of the lead having been formed oversize.

The above-mentioned electrical failures due to metal shavings shorting out contact pads or other circuitry are attributed primarily to noncircuit sides of the ceramic substrates of the substrate circuit devices having smooth sharp lower edges formed thereon as a result of the above-mentioned substrate-snapping operation. In this connection, the sharp edges shave off portions of the tin coatings and base metal of the curved outer clamping fingers of the leads across the width of the fingers as the leads are forced onto the substrate circuit devices. Then, during subsequent handling, including soldering of the leads to the substrate circuit devices in the mass soldering operation as above described, the metal shavings apparently fall onto, or otherwise migrate to, circuit sides of the substrate circuit devices to produce shorts therein. Upper edges of the ceramic substrates formed by the above-mentioned laser-scribing also tend to shave metal from the circular portions of the contact fingers of the leads, but to a lesser degree. The shaving of metal from the leads is further aggravated when the substrate-receiving gaps of the leads are formed undersize, thus requiring an abnormally high insertion force to assemble the leads to a substrate circuit device.

Similarly, the "roll back" of the lead contact fingers is attributed to the need to force the leads on the substrate circuit devices in order to assure firm mechanical engagement of the lead contact fingers with their respective contact pads. More specifically, during insertion of one of the substrate circuit devices into the gaps defined by the respective lead fingers, an upper edge of the substrate circuit device engages the circular clamping portions of the contact fingers at an angle to the horizontal in excess of 45°. As a result, a major component of the insertion force required in the assembling operation is directed horizontally against the lead contact fingers, rather than vertically so as to cause flexing of the contact fingers with respect to the opposed curved outer clamping fingers for the reception of the substrate circuit device. Accordingly, the lead contact fingers tend to buckle and be "rolled back" by the substrate circuit device as noted above. As in the case of the forming of metal shavings as discussed above, this "roll back" of the lead contact fingers is further aggravated when the substrate-receiving gaps of the leads have been formed undersize.

Accordingly, a primary purpose of this invention is to provide a solder-bearing lead which requires a low-insertion force to assemble the lead to a substrate and with which the incidence of electrical and/or mechanical failures as a result of the assembling operation is reduced.

SUMMARY OF THE INVENTION

In general, a low-insertion force solder-bearing lead comprises first and second resilient clamping fingers having respective substrate clamping portions extending from an elongated stem in opposed relationship to define a gap for the reception of a substrate. The first substrate clamping portion has an inner planar surface for engaging an opposed planar surface of the substrate in parallel mating relationship. The second substrate clamping portion is partially wrapped about a solder preform in clamping relationship and includes a noncircular outer end portion. The noncircular outer end portion and adjacent noncircular surface portions of the solder preform define a noncircular camming surface which, at a point of initial engagement by the substrate during a lead and substrate assembling operation, extends relative to the inner planar surface of the first substrate clamping portion at an angle of no more than 45°.

More specifically, the noncircular camming surface may have a planar or an elliptical configuration which, at the point of initial engagement by the substrate during a lead and substrate assembling operation, extends relative to the inner planar surface of the first substrate clamping portion at an angle on the order of 30°. The solder preform also may be mounted on an inner surface of the second substrate clamping portion which is wrapped about the preform in a direction facing toward the first substrate clamping portion and to a point such that the noncircular outer end portion and the adjacent noncircular side surface portions of the preform directly engage a contact pad on the substrate when the substrate is received between the clamping portions. A part of the noncircular outer end portion may be embedded in the solder preform such that the adjacent noncircular side surface portions of the preform project beyond the outer end portion toward the inner planar surface of the first substrate clamping portion. The lead also may include at least two of the first resilient clamping fingers. Further, each of the first resilient clamping fingers may include a portion which is defined by an essentially straight-line extension of the lead stem, and may further include an arcuate portion interconnecting the extension and the substrate clamping portion of the finger. The stem extensions also may have respective stop tabs extending into the gap defined by the substrate clamping portions to preclude the substrate from engaging the arcuate portions of the first resilient clamping fingers.

DETAILED DESCRIPTION

Figure 1:
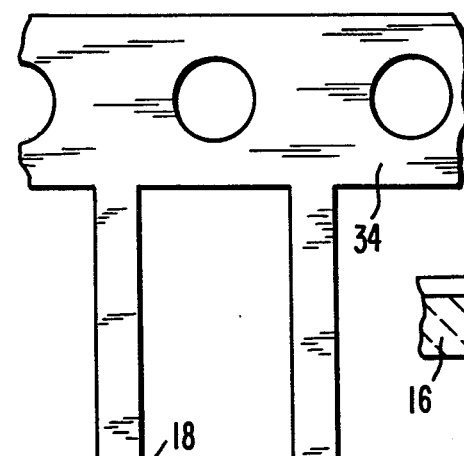
FIG. 1 is an elevational view of a portion of a strip of solder-bearing leads in accordance with the invention.

Referring to FIGS. 1, 2, 3 and 4, the embodiment of the invention as disclosed in these figures is directed to a solder-bearing lead 10 of a type as disclosed in the copending application Ser. No. 402,684, filed July 28, 1982, in the name of P. J. Ouellette and assigned to the same assignee as the subject application. In this connection, each lead 10 carries a mechanically clamped solder preform 12 (FIGS. 1, 2 and 3) for bonding the lead to a respective contact pad 14 (one shown in FIGS. 2, 3 and 4) on a rigid substrate circuit device 16. More specifically, each lead 10 includes an elongated stem 18, a pair of spaced outer resilient clamping fingers 20 and an opposed central resilient clamping finger 22. The solder preform 12 is carried on an inner surface 24 of the central resilient clamping finger 22, which defines an electrical contact having opposite end portions of the preform projecting in a cantilevered fashion from opposite sides of the contact finger.

Figure 2:
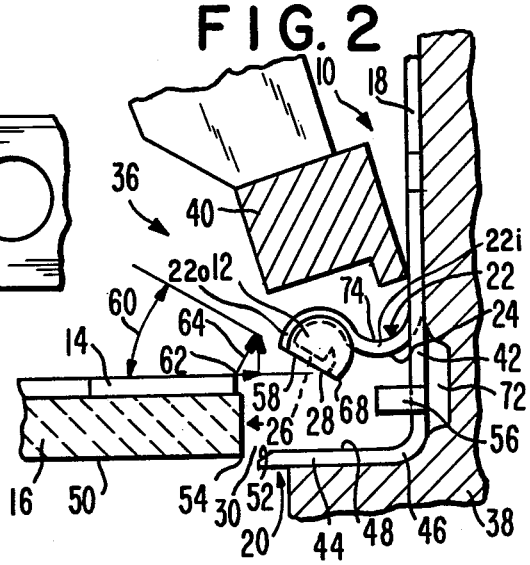
FIG. 2 is a partial side view of a solder-bearing lead in accordance with the invention, illustrating a first stage of a lead-substrate assembling operation.
Figure 3:
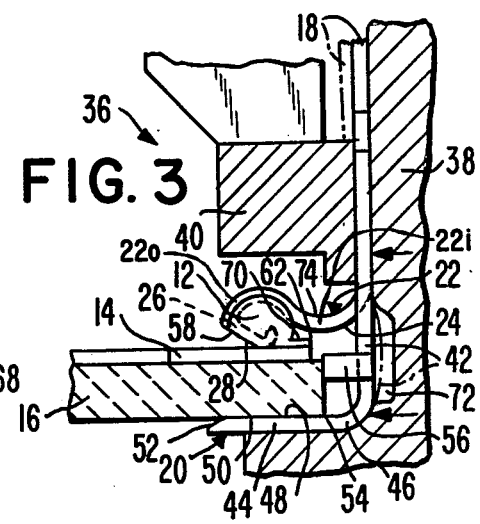
FIG. 3 is a view similar to FIG. 2, showing the solder-bearing lead thereof in a subsequent stage of the lead-substrate assembling operation.
Figure 4:
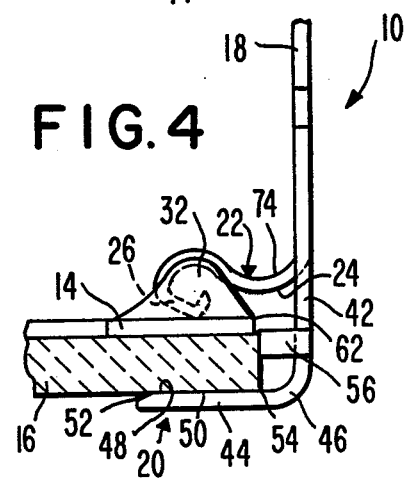
FIG. 4 is a partial side view of the solder-bearing lead after the lead has been assembled and soldered to a substrate circuit device.

As is clearly shown in FIG. 2, the central contact finger 22 of each lead 10 includes an inner U-shaped connecting portion 22i which is reverse-bent with respect to the lead stem 18, an outer arcuate portion 22o which is reverse-bent with respect to the U-shaped connecting portion, and an outer end portion 26. The connecting portion 22*i* and the arcuate portion 22*o* extend generally in an outward direction (to the left in FIG. 2) from the lead stem, and the outer end portion 26 extends downward and generally in a reverse direction (to the right in FIG. 2). In this regard, the central contact finger 22 of each lead 10 is wrapped about a central portion of the solder preform 12 so that the downwardly extending outer end portion 26 of the contact finger, and downwardly extending, spaced opposite end surface portions 28 (FIG. 2) of the solder preform, are in opposed spaced relationship to the pair of outer resilient clamping fingers 20. Thus, the contact finger outer end portion 26, and the solder preform surface portions 28, and the outer resilient clamping fingers 20, define opposite upper and lower sides of a gap 30, respectively, as viewed in FIG. 2, in which the substrate circuit device 16 is receivable with a tight-fit for mounting the lead on the substrate circuit device. The outer end portion 26 of the contact finger 22 and the preform surface portions 28 also directly engage the contact pad 14 on the substrate circuit device 16, as shown in FIG. 3, when the lead 10 is assembled with the device. Accordingly, when the solder preform 12 reaches a molten state in a soldering operation, as soon as the surface tension of the molten solder is reduced sufficiently by associated flux to permit flow of the solder, the preform flows directly over the surface of the contact pad 14 to form a soldered connection 32 (FIG. 4) between the contact finger 22 of the lead 10 and the contact pad. At the same time, the outer portion 26 of the contact finger 22 firmly engages the contact pad 14 prior to becoming embedded in the resolidified solder, as shown in FIG. 4, to establish a strong and reliable electrical and mechanical connection with the contact pad.

The stems 18 and the resilient clamping fingers 20 and 22 of the leads 10 are formed of a base metal, such as phosphorous bronze, which is not readily wetted by solder when oxidized as a result of exposure to the atmosphere, and which is coated on opposite surfaces thereof with thin coatings (not shown) of a metal which is readily wetted by solder, such as tin. The tin coatings (not shown) facilitate the making of electrical soldered connections (such as the soldered connections 32) to the leads 10. The stems 18 of the leads 10 also are formed integrally with an elongated continuous apertured support rail 34 (FIG. 1) which subsequently is clipped from the stems after the leads 10 have been mounted on the substrate circuit device 16 and soldered to their respective contact pads 14 as shown in FIG. 4. The stems 18 of the leads 10 then subsequently are inserted through apertures in circuit pads on a printed circuit board (not shown) and soldered to the circuit pads in a known manner.

As is illustrated in FIGS. 2 and 3, a plurality of the leads 10 may be assembled to opposite sides (only one side shown) of the substrate circuit device 16 simultaneously, utilizing apparatus as disclosed in U.S. Pat. No. 4,177,554, issued Dec. 11, 1979, to E. E. Deveres et al. More specifically, the substrate circuit device 16 is fed into an assembling station 36 and supported therein by a vacuum feed mechanism (not shown). A plurality of the leads 10 are fed in strip form into each side of the assembling station 36 and onto a seat portion of a reciprocable pusher slide 38 located adjacent the respective side of the assembling station. Spring-loaded clamping bars 40 then are moved into engagement with the leads 10 on each pusher slide 38, as shown in FIG. 2, to hold the leads against the seat portion of the slide. As the pusher slides 38 then are advanced toward the substrate circuit device 16, sets of the leads 10 are severed from their respective strips by a cutting mechanism (not shown) and the sets of leads are assembled to the respective sides of the device as shown in FIG. 3.

In accordance with this invention, each of the resilient outer clamping fingers 20 of each lead 10 includes a first portion defined by a straight line extension 42 of the lead stem 18, and a substrate clamping portion 44 extending essentially perpendicularly with respect to the extension of the stem. The substrate clamping portion 44 is connected to the straight line stem extension 42 by an arcuate stem extension portion 46 of a preselected radius. Each of the substrate clamping portions 44 is of planar construction and includes an inner planar surface 48 which engages an opposed planar surface 50 of the substrate circuit device 16 in parallel mating relationship as the device is being received in the gap 30 defined by the outer clamping fingers 20 and the central contact finger 22. An outer end of each substrate clamping portion 44 also includes a chamfered surface 52 for guiding a lower corner edge 54 of the substrate circuit device 16 onto the planar inner surface 48 of the substrate clamping portion 44 in an assembling operation.

During the assembly of the leads 10 and the substrate circuit device 16, after the lower edge 54 of the substrate circuit device has come into engagement with the inner planar surfaces 48 of the substrate clamping portions 44, the inner planar surfaces and the opposed substrate surface 50 move relative to one another in parallel mating relationship. Accordingly, the lower edge 54 of the substrate circuit device 16 moves smoothly over the inner planar surfaces 48 and any tendency for the edge to scrape or shave off the above-mentioned tin coatings (not shown) and base metal from the inner planar surfaces, as is the case where the substrate clamping portions are of inverted curved construction, is significantly reduced. Thus, the production of metal shavings which could subsequently cause electrical shorts between adjacent ones of the contact pads 14 and/or associated film circuitry (not shown) on the substrate circuit devices 16, also is significantly reduced. The parallel mating relationship between the substrate clamping portions 44 and the opposed substrate surface 50 also reduces the insertion force required to assemble the lead 10 and the substrate circuit device 16, and helps stabilize the lead on the substrate circuit device.

As each lead 10 is assembled on the substrate circuit device 16, the lead is aligned and centered on the device by an end of the device being engaged by stop tabs 56 integrally formed with respective ones of the spaced lead stem extensions 42 and projecting into the gap 30 defined by the outer clamping fingers 20 and the central contact finger 22. In this connection, the stop tabs 56 extend into the gap 30 a distance at least equal to the radius of the arcuate lead portions 46 to preclude the lower leading edge 54 of the substrate circuit device 16 from engaging the arcuate portions and deflecting the substrate clamping portions 44 out of mating clamping relationship with the substrate surface 50. The stop tabs 56 also permit the first portions of the outer clamping fingers 20 to be formed as the straight-line extensions 42 of the lead stem 18, rather than portions which are offset from the lead stem for substrate-locating purposes as in other known leads, thus simplifying the fabrication of the lead 10.

To further reduce the insertion force required to assemble the substrate circuit device 16 into the gap 30 of the lead 10, and also reduce the formation of short-producing metal shavings from the central contact finger 22 of the lead, the outer end portion 26 of the central contact finger and the opposite end surface portions 28 of the solder preform 12 on opposite sides of the outer end portion are formed in a planar noncircular configuration in a suitable swaging operation during fabrication of the lead. In this regard, as is clearly shown in FIGS. 2 and 3, the contact finger noncircular outer end portion 26 is formed or embedded into the central portion of the solder preform 12 such that a noncircular outer surface of the outer end portion is essentially flush with the noncircular solder preform opposite end surface portions 28, to define a planar, noncircular camming surface 58. The planar, noncircular camming surface 58 extends relative to the inner planar surface 48 of the substrate clamping portions 44 at an angle 60 of not more than 45°, as for example, on the order of 30° as shown in FIG. 2. Accordingly, as is illustrated in FIG. 2, as an upper edge 62 of the substrate circuit device 16 engages the camming surface 58 during an assembling operation, an insertion force 64 which is exerted by the upper edge on the camming surface has a vertical component which is significantly larger than a horizontal component of the insertion force. As a result, the larger vertical component, which exerts force on the camming surface 58 in a direction away from the substrate clamping portions 44, enhances flexing of the central contact finger 22 away from the substrate clamping portions for the reception of the substrate circuit device 16 in the gap 30. Thus, the magnitude of the insertion force required for assembling the lead 10 and the substrate circuit device 16, and the tendency for the horizontal component of the insertion force 64 to "roll back" the central contact finger 22 from the adjacent contact pad 14, or for the upper edge 62 of the substrate circuit device 16 to shave metal from the central contact finger, is reduced in comparison to prior known leads.

As is shown in FIGS. 2 and 3, the outer end portion 26 of the central contact finger 22 is embedded in the solder preform 12 and terminates adjacent the upper side of the substrate-receiving gap 30, as viewed in FIG. 2, such that small tip portions 68 of the preform surface portions 28, located at the upper side of the substrate-receiving gap on the opposite sides of the outer end portion, project slightly beyond the outer end portion toward the substrate clamping portions 44. As a result, referring to FIG. 3, when the lead 10 is assembled on the substrate circuit device 16, the preform tip portions 68 wipe across a front portion of the contact pad 14 and smear a thin coating 70 (exaggerated for purposes of illustration) of solder thereon to facilitate subsequent wetting of the solder preform 12 to the contact pad in a soldering operation. At the same time, the wiping of the solder preform tip portions 68 across the contact pad 14 removes oxides formed on the surface of the preform 12, to facilitate subsequent wetting of the preform to the contact pad. In addition, the wiping of the solder preform tip portions 68 across the contact pad 14 brings a part of the outer end portion 26 of the central contact finger 22 into direct engagement with the contact pad 14, as shown in FIG. 3, to form a reliable electrical and mechanical connection with the contact pad as noted hereinabove.

With further reference to FIGS. 2 and 3, the insertion force required to assemble a plurality of the leads 10 and the substrate circuit device 16 may be further reduced by utilizing an assembling method as disclosed in the copending application Serial No. 437,587 of R. D. Mackay entitled "Low-Insertion Force Method of Assembling a Lead and a Substrate", assigned to the same assignee as the subject application, and filed on even date herewith. In utilizing the method of the Mackay application, compressive forces are applied to back surface portions of the leads 10 above and below the stop tabs 56 during the assembling of the leads and the substrate circuit device 16, as shown by the arrows in FIG. 3. For example, the application of the compressive forces can readily be accomplished by modifying the pusher slide 38 for supporting the leads 10 during an assembling operation. In this connection, an elongated horizontal slot 72 may be formed in the seat portion of the pusher slide 38 so that back surface portions of the leads 10 adjacent the stop tabs 56 are unsupported during the assembling operation. The back surface portions of the leads 10 on upper and lower sides of the stop tabs 56, however, are supported on the seat portion of the pusher slide 38 in the usual manner.

Accordingly, as the leads 10 are assembled onto the substrate circuit device 16 as shown in FIG. 3, engagement of the end of the substrate circuit device with the stop tabs 56 on the lead stem extensions 42, in combination with continued slight movement of the pusher slide 38, causes flexing of the lead stem extensions into the slot 72 in the seat portion of the pusher slide as illustrated by the broken line in FIG. 3. At the same time, the continued slight movement of the pusher slide 38 exerts the above-mentioned compressive forces on the portions of the leads 10 above and below the stop tabs 56 to bend these lead portions about the stop tabs and the end of the substrate circuit device 16 as a fulcrum, as illustrated for the lead stems 18 by the broken line in FIG. 3. Thus, the central contact fingers 22 and the planar substrate clamping portions 44 of each lead are moved toward one another into firm clamping engagement with respective opposite sides of the substrate circuit device 16. As a result, the need for maintaining a close tolerance on the dimension of the gap 30 (FIG. 2) defined by the substrate clamping fingers 20 and 22 is reduced. Further, the degree of force-fit between the substrate clamping fingers 20 and 22, and the substrate circuit device 16, with a corresponding requirement for a high insertion force which can cause damage to the leads 10, such as the formation of short-producing metal shavings and the above mentioned "roll back" of the central contact fingers 22, is also reduced. In addition, by flexing the central contact fingers 22 and the planar substrate clamping portions 44 of the leads 10 into firm engagement with the substrate circuit device 16 during the assembling operation, the possibility of the leads subsequently falling off the device because of the substrate-receiving gaps 30 of the leads having been formed oversize, is essentially eliminated.

As a result of the bending of the portions of the leads 10 about the stop tabs 56 of the leads during an assembling operation as above described, the stems 18 of the leads may become permanently bent out of vertical positions as shown in FIG. 2 to a degree such that it subsequently is difficult to align and insert the lead stems through respective apertures in contact pads on a printed circuit board (not shown) as noted hereinabove. Accordingly, to compensate for this possible overbending the lead stems 18 may be formed in a progressive punch-and-die so as to have initial positions which are slightly inclined to the vertical, as viewed in FIG. 2, if so desired. Then, during the assembling of the leads 10 to the substrate circuit device 16, the stems 18 of the leads are bent into final vertical positions as shown in FIG. 4.

To preclude the flow of molten solder from the solder preform 12 along the central contact finger 22 to the stem 18, solder-confining stops (not shown) may be formed from oxidized base metal portions on the inner surface 24 and on an outer surface 74 of the contact finger, by removing portions of the above-mentioned solder-wettable metal coatings (not shown) during fabrication of the leads, as disclosed in the U.S. Pat. No. 4,345,814 to E. A. Gutbier et al. Similar oxidized base metal solder-confining stops (not shown) may be formed on the outer clamping fingers 20 and/or the stem 18, as desired.

The solder preforms 12 may each consist of an essentially cylindrical piece of a relatively malleable solder wire, such as a 60-40 tin-lead alloy. Preferably, however, the solder preforms 12 are of a flux-bearing type suitable for use in a progressive punch-and-die, such as the number 2879 or number 4147 rosin core solder available from the Alpha Metals Company of Newark, N.J., so as to eliminate or reduce the amount of supplemental spray fluxing required in the soldering of the leads 10.

Figure 5:
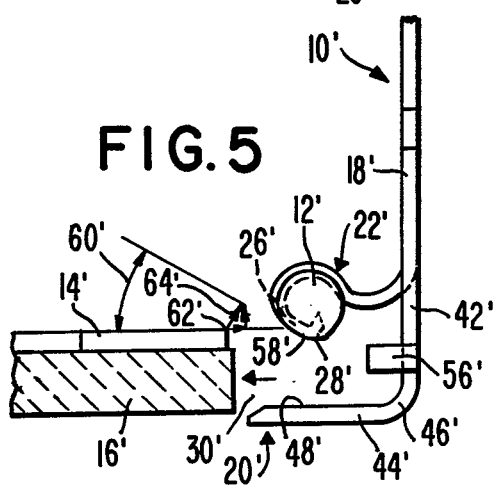
FIG. 5 is a partial side view of another embodiment of a solder-bearing lead in accordance with the invention.

Referring to the embodiment of the invention shown in FIG. 5, as in the case of the lead 10 shown in FIGS. 1-4, a lead 10' includes a pair of outer resilient clamping fingers 20' and a central contact finger 22' extending from one end of an elongated stem 18'. The outer resilient clamping fingers 20' include portions 42' defined by straight-line extensions of the lead stem 18' and planar substrate clamping portions 44' are connected to these stem extensions by arcuate stem extension portions 46'. A pair of stop tabs 56' project from respective ones of the stem extensions 42' into a substrate-receiving gap 30' defined by the substrate clamping portions 44' and the central contact finger 22'. The central contact finger 22' is wrapped about a solder preform 12' in clamping relationship.

The lead 10' in the embodiment of the invention shown in FIG. 5 differs from the lead 10 in FIGS. 1-4 in that an outer end portion 26' of the central contact finger 20', and surface portions 28' of the solder preform 12' on opposite sides of the contact finger outer end portion, are formed in an arcuate ellipsoidal configuration, rather than a planar configuration as shown by the lead 10 in FIGS. 1-4. More specifically, the contact finger outer end portion 26' and the solder preform surface portions 28' define a camming surface 58' having an ellipsoidal configuration such that a tangent line to the camming surface at an initial point of contact between the camming surface and an upper edge 62' of a substrate circuit device 16', extends relative to inner planar surfaces 48' of the substrate clamping portions 44' of the lead 10 at an angle 60' of not more than 45°, as for example, on the order of 30° as shown in FIG. 5. Accordingly, as the upper edge 62' of the substrate circuit device 16' engages the camming surface 58' during an assembling operation, an insertion force 64' exerted by the upper edge on the camming surface has a vertical component which is significantly larger than a horizontal component of the insertion force. As a result, as in the case of the lead 10 in FIGS. 1-4, it is possible to assemble the lead 10' to the substrate circuit device 16' with less insertion force in comparison to prior known leads.

In summary, a new and improved low-insertion force solder-bearing lead, such as the lead 10 or 10', has been disclosed. By way of example, with reference to the lead 10, the planar construction of the substrate clamping portions 44 of the outer resilient clamping fingers 20 facilitates assembly of the lead to the substrate circuit device 16 with a low-insertion force and also reduces any tendency for the lower edge 54 of the device to shave metal from the substrate clamping portions to form electrical short-producing metal shavings. In addition, the planar configuration of the substrate clamping portions 44 provides a stable mounting of the lead 10 on the device 16. The planar camming surface 58 defined by the outer end portion 26 and the solder preform surface portions 28 on the contact finger 22 also facilitates assembly of the lead 10 to the substrate circuit device 16 with a low-insertion force and reduces the formation of short-producing metal shavings as a result of the camming surface extending relative to the planar substrate clamping portions 44 at an angle of not more than 45°, as for example, on the order of 30°. The stop tabs 56 preclude the substrate circuit device 16 from engaging the arcuate portions 46 of the outer resilient clamping fingers 20 and thus deflecting the substrate clamping portions 44 out of mating clamping engagement with the device. The stop tabs 56 also permit portions of the clamping fingers 20 to be formed as straight-line extensions 42 of the lead stem 18, thus simplifying the fabrication of the lead 10. In addition, the tip portions 68 of the solder preform 12, which wipe across the contact pad 14 to form the thin solder coating 70 (FIG. 3) thereon and to remove oxides from the surface of the preform in the assembling operation, facilitate wetting of the preform to the contact pad in a subsequent soldering operation.

What is claimed is:

1. A low-insertion force solder-bearing lead, which comprises:

an elongated stem;

first and second resilient clamping fingers having respective substrate clamping portions extending from the elongated stem in opposed relationship for the reception of a substrate therebetween, the first substrate clamping portion of the first clamping finger having an inner planar surface for engaging an opposed planar surface of the substrate in parallel mating relationship when the substrate is inserted into the gap between the substrate clamping portions;

a solder preform mounted on the second substrate clamping portion and having at least one noncircular surface portion disposed in generally opposed relationship to the first substrate clamping portion;

the second substrate clamping portion being wrapped about a portion of the solder preform in clamping relationship and including a noncircular outer end portion disposed adjacent the noncircular surface portion of the solder preform; and the noncircular outer end portion of the second substrate clamping portion being formed into the solder preform such that a noncircular surface portion of the outer end portion is essentially flush with the noncircular surface portion of the solder preform, and such that the noncircular surface portion of the outer end portion and the noncircular surface portion of the solder preform define an outer noncircular camming surface which, at a point of initial engagement by the substrate during a lead and substrate assembling operation, extends at an angle to the inner planar surface of the first substrate clamping portion at an angle on the order of not more than 45°.

2. The low-insertion force solder-bearing lead as recited in claim 1, in which:
the noncircular camming surface has a planar configuration.

3. The low-insertion force solder-bearing lead as recited in claim 1, in which:
the noncircular camming surface has an elliptical configuration.

4. The low-insertion force solder-bearing lead as recited in claim 1, in which:
the noncircular camming surface, at the point of initial engagement by the substrate during a lead and substrate assembling operation, extends relative to the inner planar surface of the first substrate clamping portion at an angle on the order of 30°.

5. The low-insertion force solder-bearing lead as recited in claim 1, in which:
the inner planar surface of the first substrate clamping portion defines a first side of a substrate-receiving gap, and the noncircular outer end surface portion of the second substrate clamping portion and the noncircular surface portion of the solder preform define an opposite second side of the substrate-receiving gap; and
the solder perform is mounted on an inner surface of the second substrate clamping portion, and the second substrate clamping portion is wrapped about the solder preform in a direction extending toward the first substrate clamping portion such that the noncircular outer end portion of the second substrate clamping portion terminates adjacent the second side of the substrate-receiving gap, and such that the noncircular outer end surface portion of the second substrate clamping portion and the noncircular surface portion of the solder preform directly engage a contact pad on the substrate when the substrate is received between the substrate clamping portions.

6. The low-insertion force solder-bearing lead as recited in claim 5, in which:
the noncircular surface portion of the solder preform includes a tip portion located at the second side of the substrate-receiving gap; and
the noncircular outer end portion of the second substrate clamping portion terminates adjacent the tip portion of the solder preform at the second side of the substrate receiving gap such that the tip portion of the preform projects beyond the outer end portion toward the inner planar surface of the first substrate clamping portion.

7. The solder-bearing lead as recited in claim 1, in which:
the solder preform is of elongated construction and has longitudinally spaced noncircular opposite end surface portions disposed in generally opposed relationship to the first substrate clamping portion;
the second substrate clamping portion is wrapped about a central portion of the solder preform with the noncircular outer end surface portion of the second substrate clamping portion disposed between the noncircular opposite end surface portions of the preform; and
the noncircular outer end portion of the second substrate clamping portion is embedded into the central portion of the solder preform such that the noncircular surface of the outer end portion is flush with both of the noncircular opposite end surface portions of the preform.

8. The low-insertion force solder-bearing lead as recited in claim 5, in which:
the second substrate clamping portion includes an arcuate portion wrapped about the solder preform and extending outward from the elongated lead stem generally in a first direction in spaced relationship to the second side of the substrate-receiving gap; and
the noncircular outer end portion of the second substrate clamping portion extends from the arcuate portion of the second substrate clamping portion both toward the second side of the substrate receiving gap and generally in a reverse direction to the first direction in which the arcuate portion extends from the lead stem.

9. A lead-substrate assembly, which comprises:
a lead having an elongated stem and first and second resilient clamping fingers having respective substrate clamping portions extending from the stem in opposed spaced relationship;
a substrate disposed between the opposed substrate clamping portions;
the first substrate clamping portion having an inner planar surface engaged with a planar surface of the substrate in mating relationship;
a contact pad on the substrate; and
a solder mass bonded to the contact pad on the substrate;
the second substrate clamping portion including an arcuate portion extending outward from the elongated stem generally in a first direction in spaced relationship to the contact pad on the substrate; and
the second substrate clamping portion further including a noncircular outer end portion firmly engaged with the contact pad and embedded in the solder mass to form an electrical and mechanical connection with the contact pad, the noncircular outer end portion of the second substrate clamping portion extending from the arcuate portion of the second substrate clamping portion toward and into firm engagement with the contact pad relative to the inner planar surface of the first substrate clamping portion at an angle on the order of not more than 45°, and the noncircular outer end portion also extending generally in a reverse direction to the first direction in which the arcuate portion extends from the lead stem.

10. The lead-substrate assembly as recited in claim 9, in which:
the noncircular outer end portion of the second substrate clamping portion extends relative to the inner planar surface of the first substrate clamping portion at an angle on the order of 30°.

* * * * *